(12) United States Patent
Huang et al.

(10) Patent No.: US 8,952,500 B2
(45) Date of Patent: Feb. 10, 2015

(54) SEMICONDUCTOR DEVICE

(71) Applicant: IPEnval Consultant Inc., Hsinchu (TW)

(72) Inventors: Chao-Yuan Huang, Hsinchu (TW);
Yueh-Feng Ho, Hsinchu (TW);
Ming-Sheng Yang, Hsinchu (TW);
Hwi-Huang Chen, Hsinchu (TW)

(73) Assignee: IPEnval Consultant Inc., Hsinchu (TW)

( * ) Notice: Subject to any disclaimer, the term of this patent is extended or adjusted under 35 U.S.C. 154(b) by 0 days.

(21) Appl. No.: 13/833,129

(22) Filed: Mar. 15, 2013

(65) Prior Publication Data

US 2014/0264912 A1 Sep. 18, 2014

(51) Int. Cl.
*H01L 23/48* (2006.01)
*H01L 23/522* (2006.01)
*H01L 23/538* (2006.01)
*H01L 23/498* (2006.01)

(52) U.S. Cl.
CPC .......... *H01L 23/481* (2013.01); *H01L 23/5386* (2013.01); *H01L 23/49844* (2013.01); *H01L 23/5221* (2013.01); *H01L 23/5384* (2013.01)
USPC ........... 257/621; 257/776; 257/777; 438/640; 438/667

(58) Field of Classification Search
CPC .................. H01L 2924/00; H01L 2924/00014; H01L 2224/73204; H01L 2224/73265; H01L 2224/32145
USPC ................................ 257/448, 621, 758, 774
See application file for complete search history.

(56) References Cited

U.S. PATENT DOCUMENTS

| | | | |
|---|---|---|---|
| 7,799,678 B2 | 9/2010 | Kropewnicki et al. | |
| 7,851,880 B2 * | 12/2010 | Suzuki et al. | 257/448 |
| 7,989,918 B2 | 8/2011 | Bartley et al. | |
| 8,103,996 B2 | 1/2012 | Kariat et al. | |
| 8,136,084 B2 | 3/2012 | Dean, Jr. et al. | |
| 8,174,124 B2 * | 5/2012 | Chiu et al. | 257/773 |
| 8,319,336 B2 | 11/2012 | Chang et al. | |
| 8,332,803 B1 | 12/2012 | Rahman | |
| 8,344,749 B2 | 1/2013 | Stillman et al. | |
| 8,359,554 B2 | 1/2013 | Wang et al. | |
| 8,362,622 B2 | 1/2013 | Sproch et al. | |
| 2004/0262767 A1 * | 12/2004 | Matsuo | 257/758 |
| 2009/0134497 A1 * | 5/2009 | Barth et al. | 257/621 |
| 2010/0007030 A1 * | 1/2010 | Koike et al. | 257/774 |
| 2010/0121994 A1 | 5/2010 | Kim et al. | |
| 2010/0257495 A1 | 10/2010 | Wu | |
| 2011/0147909 A1 | 6/2011 | Hsuan et al. | |
| 2012/0106117 A1 | 5/2012 | Sundaram et al. | |
| 2012/0124532 A1 | 5/2012 | Coteus et al. | |
| 2012/0273782 A1 | 11/2012 | Goel et al. | |
| 2012/0304142 A1 | 11/2012 | Morimoto et al. | |
| 2012/0331435 A1 | 12/2012 | Rahman | |

FOREIGN PATENT DOCUMENTS

WO WO2012082092 A1 6/2012

* cited by examiner

*Primary Examiner* — Olik Chaudhuri
*Assistant Examiner* — John M Parker
(74) *Attorney, Agent, or Firm* — Alan D. Kamrath; Kamrath IP Lawfirm, P.A.

(57) ABSTRACT

A semiconductor device comprises a substrate, a through-silicon via (TSV) penetrating the substrate, a plurality of first interconnect structures, right above the TSV, configured for electrically coupling the TSV to a higher-level interconnect, a second interconnect structure traversing the TSV from the top and being configured for interconnect routing of an active device and a plurality of dummy metal patterns, right above the TSV, electrically isolated from the TSV, the first interconnect structures and the second interconnect structure.

15 Claims, 5 Drawing Sheets

SEMICONDUCTOR DEVICE

FIELD OF THE INVENTION

The present invention relates to a semiconductor device and particularly to a semiconductor device with a through-silicon via.

BACKGROUND OF THE INVENTION

To save precious layout space or increase interconnect efficiency, multiple chips of integrated circuits (ICs) can be stacked together as a single IC package. To that end, a three-dimensional (3D) stack packaging technology is used to package the chips of integrated circuits. Through-silicon vias (TSVs) are widely used to accomplish the 3D stack packaging technology. A through-silicon via is a vertical conductive via completely passing through a silicon wafer, a silicon board, a substrate of any material or die. Nowadays, a 3D integrated circuit (3D IC) is applied to a lot of fields such as memory stacks, image sensors or the like.

Although through-silicon vias come with many advantages, they also bring some issues into integrated circuits. For example, their gigantic size (hundred times bigger than traditional transistors) compared to their neighbors such as transistors, interconnects etc. would waste a lot of layout space. The more space they waste, the bigger a chip will be. Nowadays, all the electronic devices are expected to be small so wasting space is definitely not a smart idea. Therefore, there is a need to regain some spaces taken up by the through-silicon vias.

SUMMARY OF THE INVENTION

A purpose of this invention is to provide a semiconductor device comprising a substrate, a through-silicon via (TSV) penetrating the substrate, a plurality of first interconnect structures, right above the TSV, configured for electrically coupling the TSV to a higher-level interconnect, a second interconnect structure traversing the TSV from the top and being configured for interconnect routing of an active device and a plurality of dummy metal patterns, right above the TSV, electrically isolated from the TSV, the first interconnect structures and the second interconnect structure.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The following is the detailed description of the preferred embodiments of this invention. All the elements, sub-elements, structures, materials, arrangements recited herein can be combined in any way and in any order into new embodiments, and these new embodiments should fall in the scope of this invention defined by the appended claims. A person skilled in the art, upon reading this invention, should be able to modify and change the elements, sub-elements, structures, materials, arrangements recited herein without being apart from the principle and spirit of this invention. Therefore, these modifications and changes should fall in the scope of this invention defined only by the following claims.

There are a lot of embodiments and figures in this application. To avoid confusions, similar components are represented by same or similar numerals. To avoid complexity and confusions, only one of the repetitive components is marked. Figures are meant to deliver the principle and spirits of this invention, so the distance, size, ratio, shape, connection relationship, etc. are examples instead of realities. Other distance, size, ratio, shape, connection relationship, etc. capable of achieving the same functions or results can be adopted as equivalents.

Figure 1:
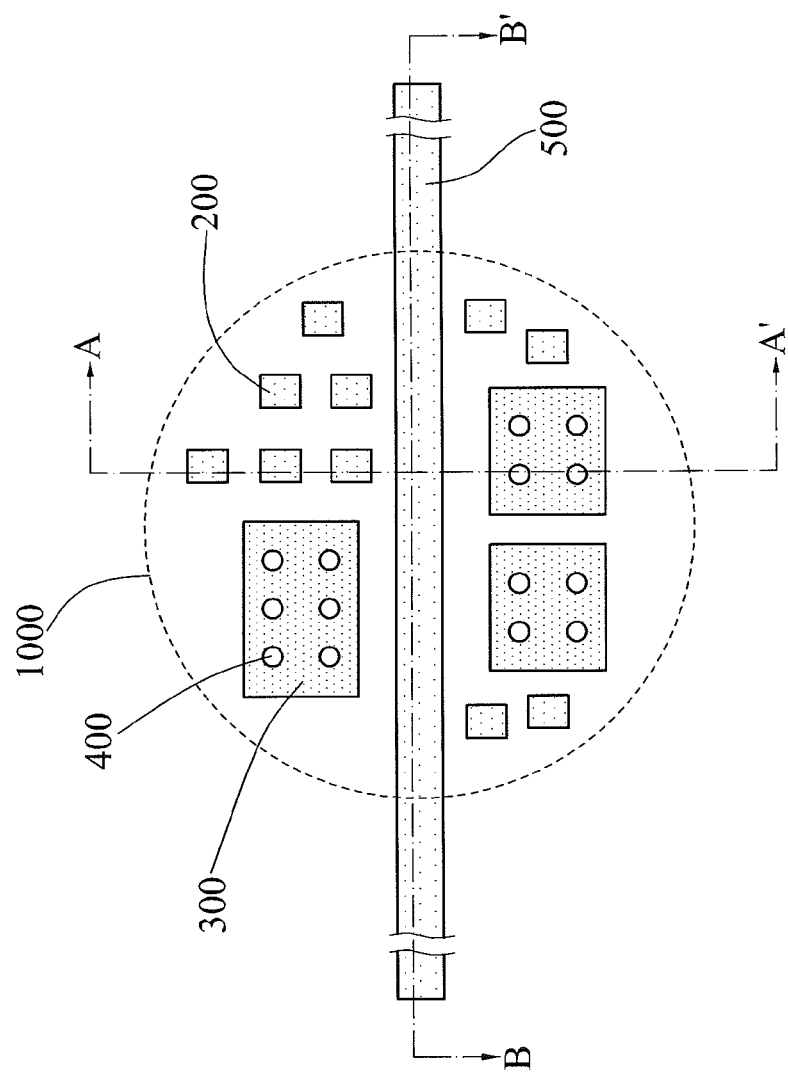
FIG. 1 shows the schematic top view of a semiconductor device with a through-silicon via (TSV) and a portion of the interconnect structures right above the TSV in accordance with an embodiment of the present invention.

Please refer FIG. 1, which shows the schematic top view of a semiconductor device with a through-silicon via (TSV) 1000 and a portion of the interconnect structures right above the TSV 1000 in accordance with an embodiment of the present invention. The interconnect structures right above the TSV 1000 comprise some conductive contacts/vias 400, some metal patterns 300 in connection with the conductive contacts/vias 400, some dummy metal patterns 200 and a long metal line 500 dividing the TSV 1000 into two regions. The TSV 1000 (in some references also known as through electrode, conductive post . . . etc.) passes "through" a substrate 100 (not shown in FIG. 1, please refer to FIG. 2A-3B) and physically and electrically connect the backside and front side of substrate 100. The TSV 1000 is configured to couple operation voltage VSS, VDD or operational signal to the integrated circuits (not shown) formed on the substrate 100. Compared to normal active devices such as transistors, TSV 1000 has a much bigger size in a scale of micrometers. In one embodiment, TSV 1000 has a diameter of 30 µm. In another embodiment, TSV 1000 has a diameter of 10 µm. In a further embodiment, TSV 1000 has a diameter of 6 µm.

The TSV 1000 shown in FIG. 2A-3B seems to be a TSV made from a via first process, however TSV 1000 may be made from a via first process (via is made before transistors), a via middle process (via is made after transistors and during lower interconnects) or a via last process (via is made after interconnects). No matter what kind of process is adopted to fabricate TSV 1000, the basic structure of TSV 1000 is the same: a through-silicon hole, a dielectric layer lining on the wall of the through-silicon hole, and a conductive material filled in the through-silicon hole. The material/materials used for the dielectric layer and the conductive material may depend on the manufacturing process and the physical properties needed. Silicon oxide and/or silicon nitride are the most commonly used material/materials for the dielectric layer. As to the conductive material, it may comprise a barrier/glue layer material such as Ta, TaN, Ti, TiN, W, WN, Mo, Mn, Cu. and a low-resistivity material such as W, Cu, Al, poly silicon.

Figure 2A:
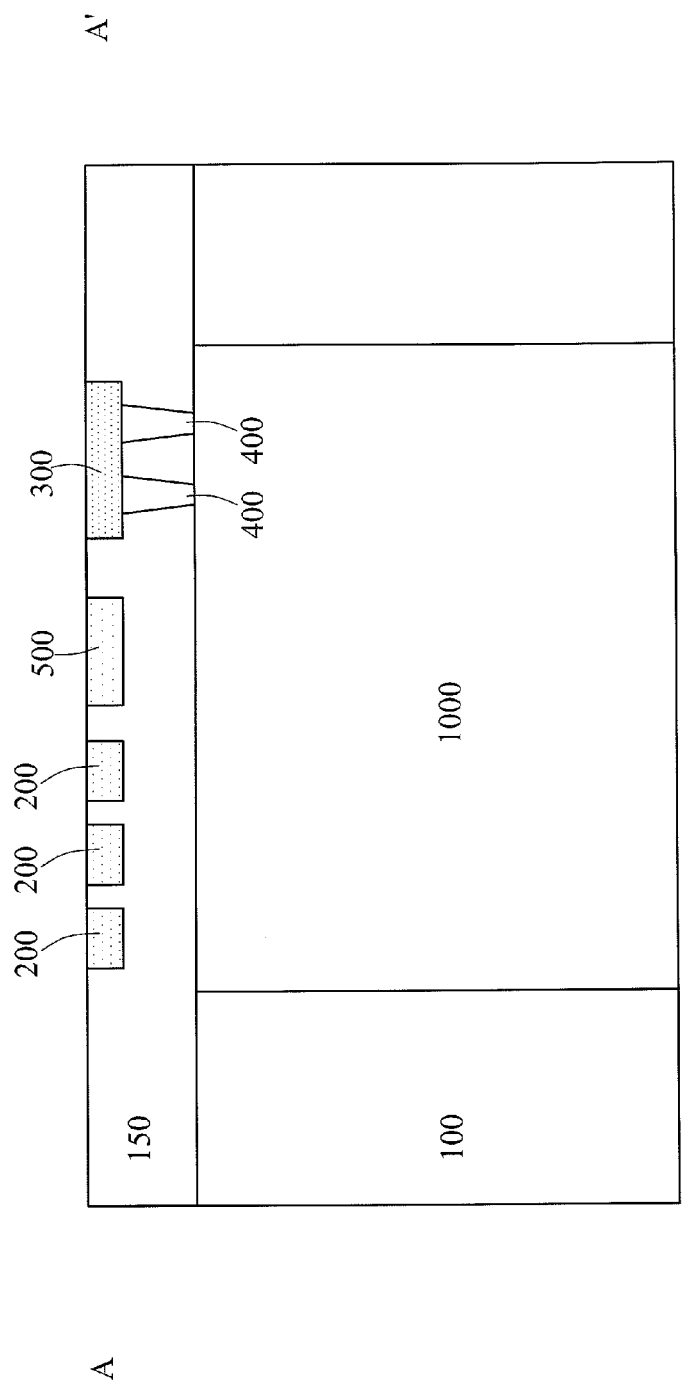
FIG. 2A show the schematic cross-sectional view taken along line A-A' in FIG. 1 in accordance with an embodiment of the present invention.

Refer to FIG. 1 again and FIG. 2A, the conductive contacts/vias 400 and the metal patterns 300 in connection with the conductive contacts/vias 400 right above the TSV 1000 are used to electrically couple TSV 1000 to higher-level interconnect structures, hence to an external interface such as a pad or micro bump. They can be made separately by different single damascene processes (contacts/vias 400 and metal patterns 300 shown in FIG. (2)), or they can be made by the same dual damascene process in one structure (that means there is no boundary between contacts/vias 400 and metal patterns 300 and they are made of the same materials). As seen in FIG. 1, the conductive contacts/vias 400 form several arrays (2×2 arrays and 2×3 arrays in FIG. 1) and all the contacts/vias 400 of the same array are connected to the same metal pattern 300. In this way, the interconnect structures used to electrically couple TSV 1000 to an external interface don't have to occupy the entire area above the TSV 1000 but divide the area above TSV 1000 into several regions or save some of the area above TSV 1000 for interconnect routing of active devices such as transistors and memory cells. In the embodiment shown in FIG. 1, a long metal line 500 for interconnect routing of active devices is allowed to traverse TSV 1000 from the top and divide the area above TSV 1000 into halves. The long metal line 500 may not pass the center of TSV 1000 but traverse the TSV 1000 eccentrically, thereby dividing the area above TSV 1000 into two halves with different sizes.

An interconnect structure for "interconnect routing of active devices" means this interconnect structure is connected to a lower interconnect structure that is in direct contact with an active device, so this interconnect structure is in electrical communication with the active device through the lower interconnect structure. In the present invention, such a interconnect structure for interconnect routing of active devices should start and end not within the region right above the TSV 1000 but a part of such a interconnect structure for interconnect routing of active devices should traverse the region right above the TSV 1000. That is, all the interconnect structures used for electrically coupling the TSV 1000 to a higher level of interconnect structures and to an external interface are not interconnect structures for interconnect routing of active devices.

Since the manufacturing processes used to fabricate contacts/vias 400 and metal patterns 300 may involve processes sensitive to pattern density/pattern distribution such as etching processes and chemical mechanical polishing (CMP) processes, adding dummy metal patterns 200 may help to avoid pattern loading effect, thereby obtaining good process uniformity. Although in FIG. 1 dummy metal patterns 200 are metal patterns, dummy contacts/vias may also be disposed under the dummy metal patterns. Therefore, dummy patterns added above the TSV 1000 may be pure metal patterns or dual damascene patterns comprising metal patterns and via patterns in connection with the metal patterns. Furthermore, the size and shape of the dummy metal patterns 200 need not to be limited. For example, some dummy metal patterns may have a square shape while other dummy metal patterns may have a strip shape. The term "dummy metal patterns" represents metal patterns of no electrical routing purposes and usually electrically insulated from other functional interconnects, TSV, active devices and passive devices. Dummy patterns not only can be beneficial to process uniformity but also can improve mechanical strength of a specific layer.

Now refer to FIG. 2A, which shows the schematic cross-sectional view taken along line A-A' in FIG. 1 in accordance with an embodiment of the present invention. As shown in FIG. 2A, TSV 1000 penetrates the substrate 100 and couple the front side and backside of the substrate 100. The substrate 100 can be a Si substrate, a polymer substrate, a silicon-on-insulator substrate, a SiC substrate, a composite substrate . . . etc. The backside is the side having no active devices such as transistors formed thereon. The backside of the substrate 100 is the opposite side of the front side of the substrate 100, wherein active devices such as transistors and interconnect structures are formed on the front side. Although it is not shown in FIG. 2A-3B, substrate 100 may comprise active devices, shallow trench isolation structures, memory cells thereon/therein. Disposed above the TSV 1000 is a dielectric layer 150. Dielectric layer 150 may be a single-layered or multi-layered structure comprising one or more dielectric material selected from silicon dioxide, silicon nitride, SiC, SiON, SiCN, TEOS-based silicon dioxide, low-k dielectric materials . . . etc. The conductive contacts/vias 400, metal patterns 300 in connection with the conductive contacts/vias 400, dummy metal patterns 200 for process uniformity and metal line 500 for interconnect routing of active devices are all embedded in the dielectric layer 150. Although it is not shown in FIG. 2A-3B, more dielectric layers and interconnect structures within may be disposed above the dielectric layer 150/150'.

Figure 2B:
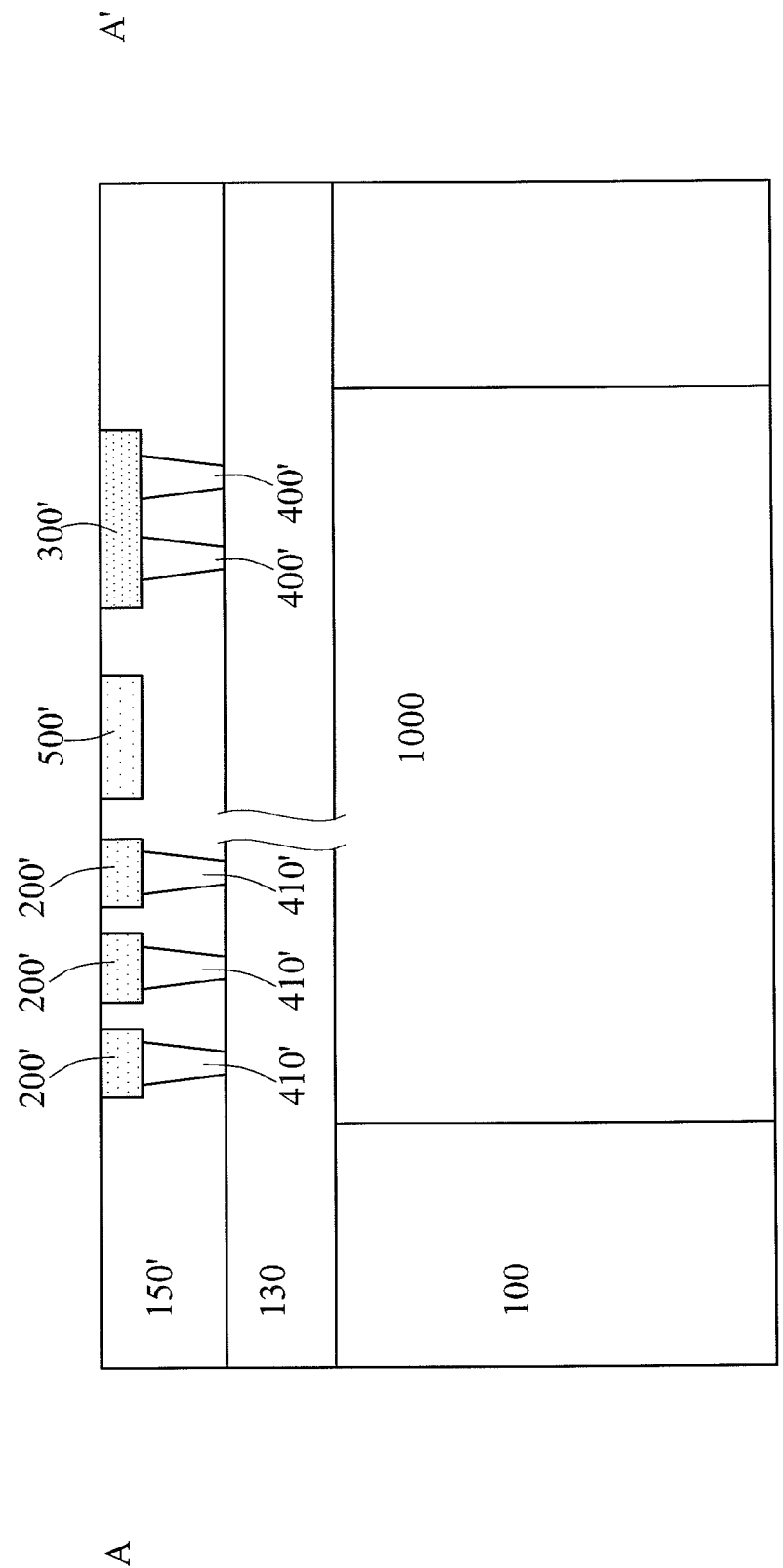
FIG. 2B show the schematic cross-sectional view taken along line A-A' in FIG. 1 in accordance with another embodiment of the present invention.

Now refer to FIG. 2(B), which shows the schematic cross-sectional view taken along line A-A' in FIG. 1 in accordance with another embodiment of the present invention. Not like the embodiment shown in FIG. 2A, in this embodiment dielectric layer 150' corresponding to the dielectric layer 150 is not directly on the TSV 1000. Between the dielectric layer 150' and the TSV 1000 is an interconnect/device layer 130. The interconnect/device layer 130 may comprise one or more dielectric layers with interconnect structures embedded therein and/or active devices formed on substrate 100. Aside from the dielectric layer 150', in this embodiment each of the dummy metal patterns 200 is replaced by a dummy via pattern 410' and a dummy metal pattern 200' in one structure. Metal line 500', metal patterns 300' and conductive contacts/vias 400' are essentially the same as the metal line 500, metal patterns 300 and conductive contacts/vias 400 in FIG. 2A.

Figure 3A:
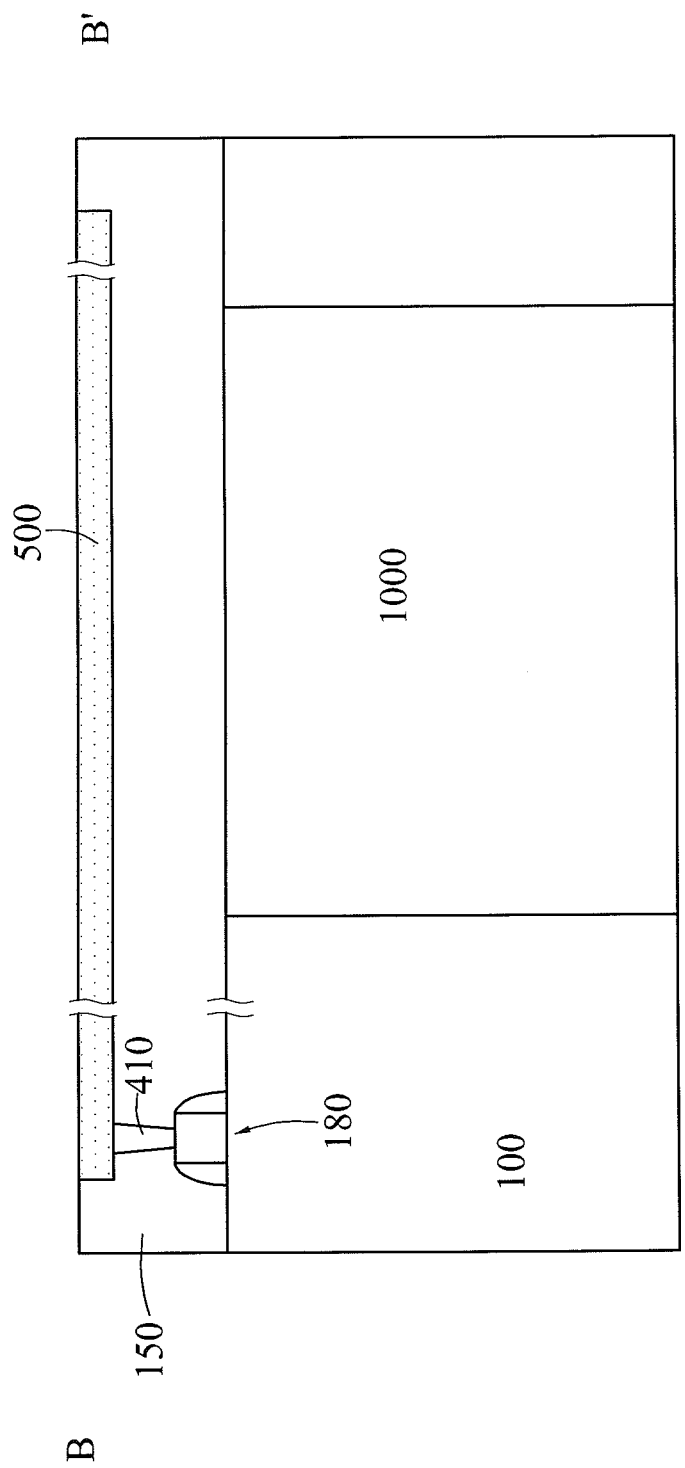
FIG. 3A show the schematic cross-sectional view taken along line B-B' in FIG. 1 in accordance with an embodiment of the present invention.

Now refer to FIG. 3A, which shows the schematic cross-sectional view taken along line B-B' in FIG. 1 in accordance with an embodiment of the present invention. FIG. 3A goes with FIG. 2A, so the dielectric layer 150 is directly on the TSV 1000. The long metal line 500 embedded in the dielectric layer 150 does not only traverse the TSV 1000 from the top but is also connected to a transistor 180 in the periphery of the TSV through a lower interconnect structure, contact 410. The long metal line 500 is usually fabricated by the same processes and from the materials used for metal patterns 300, so its detailed description will be omitted to save repetition. The transistor 180 can be an n-type MOS transistor, a p-type MOS transistor, a portion of a memory cell, or any kind of active devices made by any processes such as poly gate process, high-k first and gate first process, high-k first and gate last process, high-k last and gate last process. The lower interconnect structure is not limited to a contact in contact with the transistor 180 but may comprise a contact in contact with a doped region of an active device, a gate electrode of an active device or a pick-up region. The long metal line 500 and contact 410 may be made separately by different single damascene processes or they may be made in one structure by the same dual damascene process.

Figure 3B:
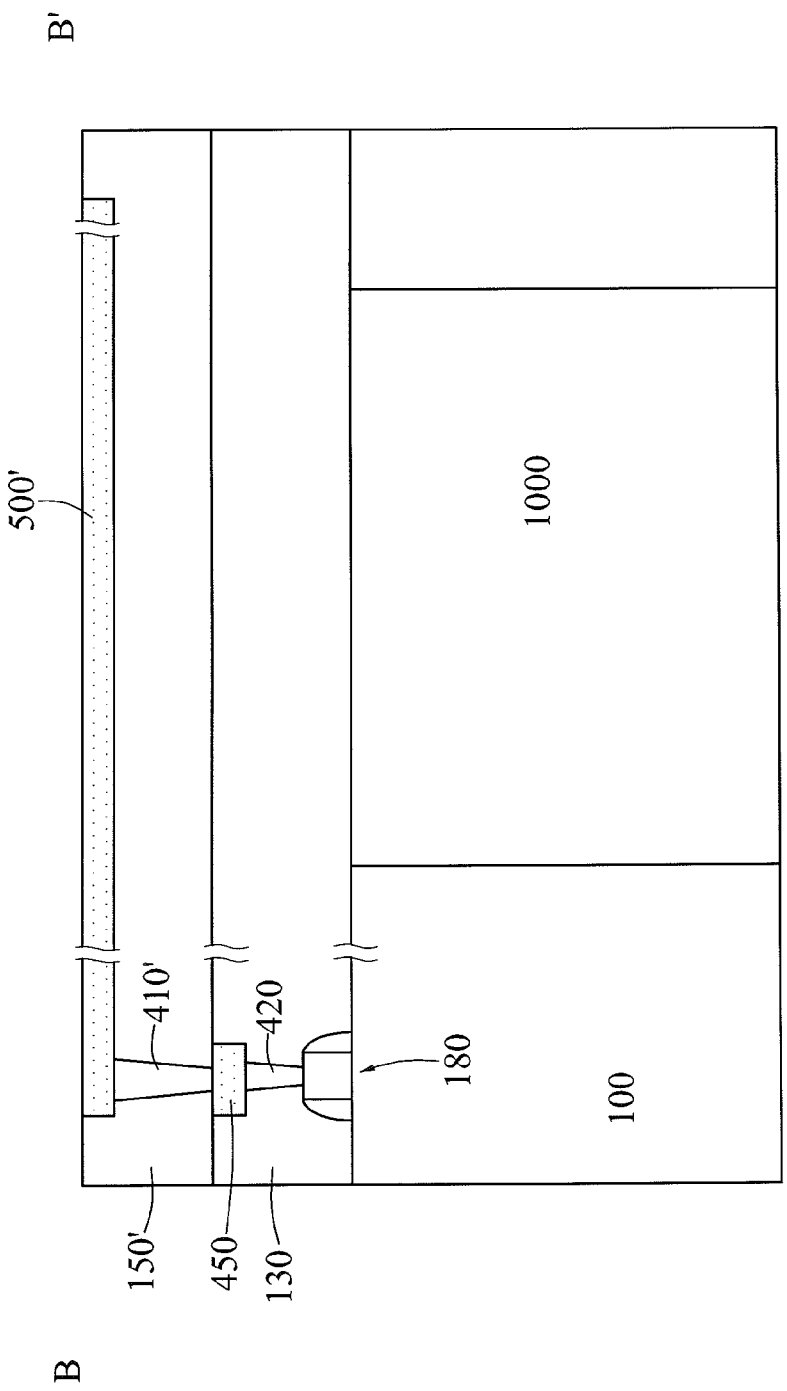
FIG. 3B show the schematic cross-sectional view taken along line B-B' in FIG. 1 in accordance with another embodiment of the present invention.

Now refer to FIG. 3B, which shows the schematic cross-sectional view taken along line B-B' in FIG. 1 in accordance with another embodiment of the present invention. FIG. 3B goes with FIG. 2(B), so the dielectric layer 150' is not directly on the TSV 1000. Between the dielectric layer 150' and the TSV 1000 is the interconnect/device layer 130. In this embodiment, the interconnect/device layer 130 comprise the transistor 180, a contact 420 in connection with the transistor 180 and a first metal pattern 450 embedded in a dielectric layer. Unlike the embodiment shown in FIG. 3A, the long metal 500' is disposed in the dielectric layer 150' and connected to the transistor 180 below it through a lower interconnect structure comprising via 410', first metal pattern 450 and contact 420. The contact 420 and first metal pattern 450 are essentially the same as the metal line 500 and contact 410 shown in FIG. 3A except the first metal pattern 450 is much shorter than the metal line 500.

From the foregoing embodiments it is clear that by using small piece of metal pattern with contact/via array to couple the TSV 1000 to an external interface, the long metal line 500/500' for interconnect routing of the transistor 180 does not have to detour in order to get around the TSV 1000 but is allowed to pass through the area right above the TSV 1000. In this way, the area right above TSVs will not be wasted and there is less restrictions for layout.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device, comprising:
   a substrate;
   a through-silicon via (TSV) penetrating the substrate;
   a plurality of first interconnect structures, right above the TSV, configured for electrically coupling the TSV to a higher-level interconnect;
   a second interconnect structure, traversing the TSV from a top, configured for interconnect routing of an active device; and
   a plurality of dummy metal patterns, right above the TSV, electrically isolated from the TSV, the first interconnect structures and the second interconnect structure.

2. The semiconductor device of claim 1, wherein the first interconnect structures, the second interconnect structure and the dummy metal patterns are disposed in the same dielectric layer.

3. The semiconductor device of claim 1, wherein the first interconnect structures is in direct contact with the TSV.

4. The semiconductor device of claim 1, wherein the first interconnect structures comprise a contact/via array and a metal layer in connection with the via array.

5. The semiconductor device of claim 1, wherein the first interconnect structures comprise a contact/via array and a metal layer in one structure.

6. The semiconductor device of claim 1, wherein the first interconnect structures is in electrical connection with the TSV without physical contact.

7. The semiconductor device of claim 1, wherein the second interconnect structure divides an area above the TSV into two halves.

8. The semiconductor device of claim 1, wherein the second interconnect structure traverse the TSV from the top eccentrically.

9. The semiconductor device of claim 1, wherein the second interconnect structure is connected to a transistor in a periphery of the TSV.

10. The semiconductor device of claim 9, wherein the second interconnect structure is connected to the transistor through a lower interconnect structure.

11. The semiconductor device of claim 10, wherein the lower interconnect structure is a contact/via.

12. The semiconductor device of claim 1, wherein the dummy metal patterns comprise a metal layer.

13. The semiconductor device of claim 1, wherein the dummy metal patterns comprise a via and a metal layer in connection with the via.

14. The semiconductor device of claim 1, wherein the dummy metal patterns comprise a via and a metal layer in one structure.

15. The semiconductor device of claim 1, wherein the substrate comprises active devices.

* * * * *